(12) United States Patent
Milke et al.

(10) Patent No.: US 9,397,064 B2
(45) Date of Patent: Jul. 19, 2016

(54) ALUMINUM ALLOY WIRE FOR BONDING APPLICATIONS

(71) Applicant: Heraeus Deutschland GmbH & Co. KG, Hanau (DE)

(72) Inventors: Eugen Milke, Nidderau (DE); Sven Thomas, Frankfurt (DE); Ute Geissler, Berlin (DE); Martin Schneider-Ramelow, Berlin (DE)

(73) Assignee: Heraeus Deutschland GmbH & Co. KG, Hanau (DE)

( * ) Notice: Subject to any disclaimer, the term of this patent is extended or adjusted under 35 U.S.C. 154(b) by 0 days.

(21) Appl. No.: 14/443,848

(22) PCT Filed: Nov. 12, 2013

(86) PCT No.: PCT/EP2013/073541
§ 371 (c)(1),
(2) Date: May 19, 2015

(87) PCT Pub. No.: WO2014/079726
PCT Pub. Date: May 30, 2014

(65) Prior Publication Data
US 2015/0303165 A1  Oct. 22, 2015

(30) Foreign Application Priority Data

Nov. 22, 2012 (EP) .................................. 12007886
Dec. 17, 2012 (EP) .................................. 12008371

(51) Int. Cl.
*H05K 1/11* (2006.01)
*H01L 23/00* (2006.01)
(Continued)

(52) U.S. Cl.
CPC ................ *H01L 24/45* (2013.01); *B21C 1/003* (2013.01); *B21C 9/00* (2013.01); *B23K 35/0266* (2013.01); *B23K 35/286* (2013.01); *C22C 21/00* (2013.01); *C22C 21/02* (2013.01); *C22F 1/04* (2013.01);
(Continued)

(58) Field of Classification Search
CPC ........... C22C 21/00; C22C 21/02; C22F 1/04; B23K 35/286; B23K 35/0266; H05K 1/11
USPC ............................ 174/261; 148/415, 437, 688
See application file for complete search history.

(56) References Cited

U.S. PATENT DOCUMENTS 3,619,181 A * 11/1971 Willey .................... C22C 21/00
148/415
5,541,007 A * 7/1996 Ueda ....................... C22C 21/00
148/437

(Continued)

FOREIGN PATENT DOCUMENTS

JP  H07-316705 A  12/1995
WO  2013035699 A1  3/2013

OTHER PUBLICATIONS

Search Report dated Nov. 25, 2014 in TW Application No. 102142719.

(Continued)

*Primary Examiner* — Sherman Ng
(74) *Attorney, Agent, or Firm* — Panitch Schwarze Belisario & Nadel LLP

(57) ABSTRACT

The invention is related to a bonding wire containing a core having a surface. The core contains aluminum as a main component and scandium in an amount between 0.05% and 1.0%.

15 Claims, 1 Drawing Sheet

(51) Int. Cl.
  *C22C 21/00* (2006.01)
  *H01B 1/02* (2006.01)
  *B23K 35/28* (2006.01)
  *B23K 35/02* (2006.01)
  *C22C 21/02* (2006.01)
  *B21C 1/00* (2006.01)
  *B21C 9/00* (2006.01)
  *C22F 1/04* (2006.01)

(52) U.S. Cl.
  CPC ............. *H01B 1/023* (2013.01); *H01L 24/43* (2013.01); *H05K 1/111* (2013.01); *H01L 2224/432* (2013.01); *H01L 2224/4321* (2013.01); *H01L 2224/43848* (2013.01); *H01L 2224/45015* (2013.01); *H01L 2224/45124* (2013.01); *H01L 2224/4847* (2013.01); *H01L 2924/013* (2013.01)

(56) References Cited

U.S. PATENT DOCUMENTS 5,620,652 A    4/1997   Tack et al.
2014/0224523 A1  8/2014   In et al.

OTHER PUBLICATIONS

Office Action issued in TW Application No. 102142719.

Int'l Search Report issued Jan. 22, 2014 in Int'l Application No. PCT/EP2013/073541.

European Search Report issued Nov. 28, 2013 in EP Application No. 12008371.2.

Office Action issued Feb. 23, 2016 in SG Application No. 11201504021Q.

* cited by examiner

ALUMINUM ALLOY WIRE FOR BONDING APPLICATIONS

CROSS-REFERENCE TO RELATED APPLICATIONS

This application is a Section 371 of International Application No. PCT/EP2013/073541, filed Nov. 12, 2013, which was published in the English language on May 30, 2014 under International Publication No. WO 2104/079726 A1, and the disclosure of which is incorporated herein by reference.

BACKGROUND OF THE INVENTION

Bonding wires are used in the manufacture of semiconductor devices for electrically interconnecting an integrated circuit and a printed circuit board during semiconductor device fabrication. Further, bonding wires are used in power electronic applications to electrically connect transistors, diodes and the like with pads or pins of the housing. While bonding wires were originally made from gold, nowadays less expensive materials such as aluminum are used. While aluminum wires provide very good electric and thermal conductivity, bonding of aluminum wires has its challenges.

Generally, bonding wires in the sense of the invention are optimized for use with high speed bonding tools, in which ball-bonding or second bonding (wedge bonding) is typically used to connect an end of the wire with a surface like a bond pad. In the case of aluminum based wires, wedge-wedge-bonding is predominantly used. Bonding wires have to meet specific demands in order to be compatible with bonding tools, at least within practicable process windows.

The term bonding wire may be understood to comprise all shapes of cross-sections and all usual wire diameters. Bonding wires with circular cross-section and thin diameters are possible, as well as thick bonding wires with circular cross sections or flatted cross sections for high power applications. Bonding wires with flatted cross sections are also called ribbons.

Some recent developments were directed to bonding wires having a core material based on aluminum as a main component due to its lower price compared with gold and other materials. Nevertheless, there is an ongoing need for further improving bonding wire technology with regard to the bonding wire itself and the bonding processes.

BRIEF SUMMARY OF THE INVENTION

The invention is related to a bonding wire comprising a core having a surface, wherein the core comprises aluminum as a main component and the core contains scandium in an amount between 0.05% and 1.0%.

The invention further relates to a system for bonding an electronic device with a wire according to the invention and a method for manufacturing a wire according to the invention.

It is an object of the invention to provide improved bonding wires.

Thus, it is another object of the invention to provide a bonding wire which has good processing properties and which has no specific needs when interconnecting, thus saving costs.

It is also an object of the invention to provide a bonding wire which has excellent electrical and thermal conductivity.

It is a further object of the invention to provide a bonding wire which exhibits improved reliability.

It is a further object of the invention to provide a bonding wire which exhibits excellent bondability.

It is another object of the invention to provide a bonding wire which shows improved bondability with respect to a second bonding or wedge bonding.

It is yet another object of the invention to provide a bonding wire having high tensile strength at least during drawing of the wire.

It is yet a further object of the invention to provide a bonding wire having low electrical resistivity.

It is another object to provide a system for bonding an electronic device, which system provides a reliable connection between bonding pads like an electronic device and/or a packaging.

It is another object to provide a method for manufacturing an inventive bonding wire which basically exhibits no increase in manufacturing costs compared with known methods.

Surprisingly, wires of the present invention have been found to solve at least one of the objects mentioned above. Further, a process for manufacturing these wires has been found which overcomes at least one of the known challenges of manufacturing wires. Further, systems comprising the wires of the invention were found to be more reliable at the interface between the wire according to the invention and other electrical elements.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 1:
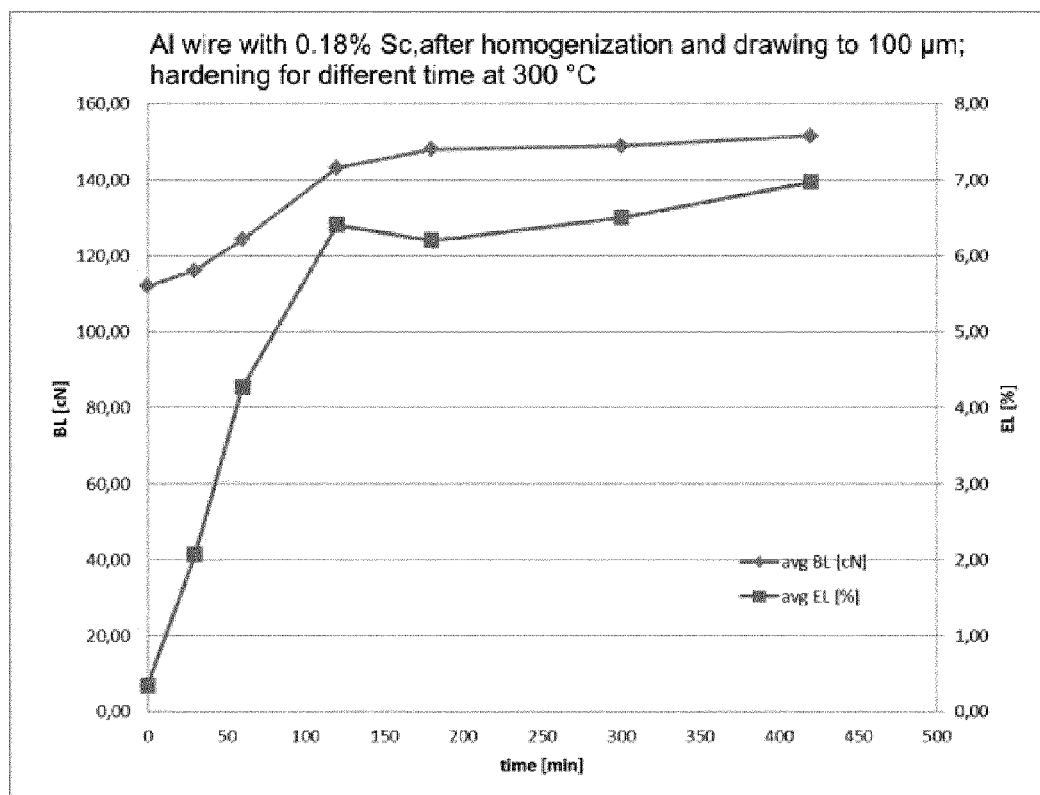
FIG. 1 is a graph of tensile strength and elongation of a wire according to an embodiment of the invention.

A first aspect of the invention is a bonding wire comprising a core having a surface, wherein the core comprises aluminum as a main component and the core contains scandium in an amount between 0.05% and 1.0%.

If not particularly defined otherwise, all contents or shares of components are given as shares in weight. In particular, component shares given in percent are meant to be weight-%, and component shares given in ppm (parts per million) are meant to be weight-ppm. For percentage values concerning denumerable objects like grains or particles, the given values are shares of a total number of the objects.

Preferably, the wire according to the invention has no coating layer covering the surface of the core. This provides for a simple and cost saving manufacturing of the wire. This does not exclude that for specific applications, there may be an additional coating layer provided on the surface of the core of an inventive wire.

It is to be understood that at least some thin layer is expected on the core of a finished wire, as the wire according to the invention is based on aluminum and hence almost instantaneously forms some oxide layer even if exposed to air for just a short time. For definition purposes, the given features and properties of the core of the wire are related to the unaffected core material below such an unintentional surface region.

A component is a "main component" if the share of this component exceeds all other components of a referenced material. Preferably, a main component comprises at least 50% of the total weight of the material.

The scandium content according to the invention is selected such that beneficial effects are present without disadvantageous effects becoming dominant. If a scandium content of more than 1% is utilized, high amounts of large grains of scandium or scandium containing phases are present in the core material. If the amount and size of such grains exceed certain limits, the mechanical properties of the wire are impaired. If a scandium content of less than 0.05% is utilized, beneficial properties added by the scandium are no longer significant.

In a preferred embodiment of the invention, the scandium content is optimized to be in a range between 0.1% and 0.35%. In a most preferred embodiment, the scandium content of the core is in the range between 0.12% and 0.25%.

In a generally preferred embodiment of the invention, the core contains between 0% and 0.5% of silicon. It has been surprisingly found that although silicon is a standard component of conventional aluminum based bonding wires in typical amounts of 1%, a low silicon content in an inventive wire has beneficial impacts. Good tensile strength may be reached even without any silicon, while the electrical conductivity is excellent at the same time. Even more preferred, the silicon content is maintained to be between 0% and 0.2%. In a most preferred embodiment of an inventive wire, no silicon other than unavoidable traces, in particular less than 100 ppm, is present.

As a general advantageous feature of an inventive wire, the total of the components of the core other than aluminum and scandium is between 0% and 1.0%. More preferably, the content of these other components sums up to less than 0.5%, most preferably less than 0.2%. This results in high conductivity because little disturbance in the aluminum crystal is caused by additional components.

In order to enhance the corrosion resistance of the wire, the core preferably contains at least one element selected from copper and nickel in an amount between 10 ppm and 100 ppm. Most preferably, the nickel content or the copper content is between 30 ppm and 80 ppm.

For achieving low thermal losses due to resistive heating, an inventive wire preferably has a conductivity of at least $32.0*10^6$ Ohm$^{-1}$*m$^{-1}$. Most preferably, the conductivity is at least $33.0*10^6$ Ohm$^{-1}$*m$^{-1}$. The conductivity of an inventive wire may be influenced not only by selecting its elemental composition, but also by defined treatment like annealing or homogenization. Although in principle the conductivity is a material dependent constant, there may be some dependency on the wire diameter, at least for very small diameters. For definition purposes, the conductivity given herein is measured with thick bonding wires of about 100 μm diameter.

In a specific embodiment of the invention, at least 30% of the scandium in the core is present in a phase separate from the aluminum main component. It is understood that up to a certain extent, scandium may be completely dissolved in the aluminum matrix. Such a state of dissolved scandium does not represent a separate phase. Under certain conditions, the scandium may at least be partially present in a different phase. Such a phase is usually identified by crystalline or even amorphous grains, which are separate from the main aluminum phase. The properties of such a scandium-containing phase, such as grain size, grain size distribution, composition etc. depend on specific heat treatment and/or on the presence of additional components.

Preferably, the scandium-containing phase is an intermetallic phase comprising mainly $Al_3Sc$. Intermetallic phases are presently defined as homogenous chemical compounds comprising two or more metals. The intermetallic phases have a lattice structure different from the lattices of the constituent metals.

Most preferably, at least two thirds of a total number of crystallites of the intermetallic phase have a diameter of less than 25 nm. It has been surprisingly found that once the wire core is adjusted to such parameters, an optimum combination of electrical and mechanical properties is achieved.

In one possible embodiment of the invention, the wire has a diameter in the range of 80 μm to 600 μm. Such wires are defined as "thick wires" in the sense of the invention. In this respect, the cross sectional shape of the wire is considered to be circular. Independent of the cross sectional shape, thick wires in the sense of the invention are wires which have a cross sectional area of at least about 5000 μm$^2$, which is about the cross sectional area of a circular wire of 80 μm diameter.

In other embodiments of the invention, the wire has a diameter in the range of 8 μm to 80 μm. Such wires are defined as "thin wires" in the sense of the present invention. In the case of thin wires, circular cross sections are usually preferred, though flat cross sections are possible.

For all types of bonding wires, and specifically in the case of thin wires, there are high demands on the tensile strength of the wire material, at least when drawing the wire to the final diameter. For conventional wires, this means that certain aluminum alloys need to be chosen to allow for the desired tensile strength. In the case of the present invention, sufficient tensile strengths, even for drawing of thin wires, are achieved by the addition of scandium and a controlled heat treatment of the wire. This is true even for wires containing no components other than aluminum and small amounts of scandium.

A further aspect of the invention is a system for bonding an electronic device, comprising a first bonding pad, a second bonding pad and a wire as previously described, in which the wire is connected to at least one of the bonding pads by wedge-bonding.

In a preferred embodiment of such system, a structure underlying the bonding pads contains at least one layer of porous silicon dioxide. The hardness of the inventive wires may be adjusted in order to meet requirements of mechanically sensitive structures aligned below the bond pad. This is particularly true if the bond pad consists of a soft material like aluminum or gold. The sensitive structure may, for example, contain one or several layers of porous silicon dioxide, in particular with a dielectric constant of less than 2.5. Such a porous and hence weak material is becoming increasingly common as it can help to increase the device performance. Therefore, the mechanical properties of the inventive bonding wire are optimized to avoid cracking or other damaging of the weak layers. The optimization may be achieved by specific annealing procedures, depending on the respective demands.

A wire according to the invention may advantageously be used in a system with high operating temperatures. Preferably, standard operating temperatures are permanently up to 175° C., preferably up to 250° C. It is also possible to use a wire according to the invention with very high permanent operating temperatures up to 300° C. It has been found that such high temperatures do not interfere with the demanded behavior of the alloyed scandium in the wire.

For some embodiments of a system for bonding an electronic device, a controlled formation of a scandium containing phase, in particular an intermetallic $Al_3Sc$ phase, is achieved during the bonding procedure of the bonded device.

A further aspect of the invention is a method for manufacturing a bonding wire according to the invention, comprising the steps of:

a. providing an aluminum core precursor with a desired content of scandium; and b. drawing and/or rolling the precursor to reach a final diameter of the wire core.

A precursor of the wire core is defined to be any structure which has to be further deformed in order to obtain the final wire shape. Such a precursor may, for instance, be provided by extrusion of a raw material into a cylindrical shape, in which the raw material already contains the desired composition. Such a precursor may be obtained simply by melting a defined amount of aluminum, adding the further components in the defined amounts, and making a homogenous mixture. The wire core precursor may then be cast or formed in any known manner from the molten or solidified alloy, e.g., by casting or by extrusion.

The formation of the precursor into the final wire shape is usually done by a series of drawing steps. In cases of wires with circular cross section, drawing may be the only forming step. In other cases, in particular for ribbons, the method may include alternative or additional rolling steps. It is to be understood that there may be further steps of different deformation methods included.

In a generally preferred embodiment, a step of homogenization of the core precursor or the final wire is included. Homogenization of the aluminum based material may be understood to be a heating procedure in which at least a major share of the contained scandium is dissolved in the aluminum. Most preferably, the entire scandium share is dissolved in the aluminum. This allows for controlled adjustment of the crystal structure. Depending on the demands, the final wire may even be fed to a bonding tool with all of the scandium remaining in a dissolved state. In such a case, a scandium-containing intermetallic phase may be formed later in the bonding process, or even after the bonding, or even during the operation of the bonded device.

Most preferably, though, the homogenization is followed by some defined treatment step in order to modify the crystal structure and particularly in order to form a defined scandium-containing phase.

Generally preferred, the step of homogenization is performed prior to a final drawing step. This may help to improve the wire properties because lattice defects are added in the final drawing step, which can support the formation of a specifically fine scandium-containing intermetallic phase later on.

In order to achieve sufficient dissolution of the scandium, the step of homogenization preferably involves heating the core precursor or the final wire to a homogenization temperature of at least 450° C., more preferably at least 550° C., for a defined time. Even more preferably, the heating is followed by rapid cooling at a rate of at least 10 K per second, more preferably at least 100 K per second. Such rapid cooling may be achieved by simple measures like, e.g., dipping the wire into a cold liquid like water.

In a most preferred embodiment, a step of precipitation hardening of the wire is performed. Precipitation hardening is defined as an annealing step in which crystal grains condense and grow in a controlled manner in order to enhance mechanical strength of the wire. This leads to an increase in the wire hardness and in particular to an increase in the tensile strength of the wire. A preferred temperature range for precipitation annealing is between 250° C. and 400° C., and an exposure time of the wire is typically at least 30 minutes. In a most preferred embodiment, the precipitation hardening leads to the formation of a finely dispersed $Al_3Sc$ intermetallic phase. The finely dispersed $Al_3Sc$ intermetallic phase has a grain size of preferably less than 500 nm, more preferably less than 300 nm, even more preferably less than 150 nm and most preferably less than 25 nm. A particularly preferred range of the grain size is 20-200 nm.

A tensile strength of a preferred wire is chosen to be at least 140 MPa, more preferably 160 MPa, and most preferably at least 180 MPa. Such tensile strength in particular allows for an easy and reliable drawing of even thin wires. In the case of thick wires, the tensile strength is less critical with respect to the manufacturing process. For definition purposes, the tensile strength of the material is measured with a circular wire of 100 µm diameter. It surprisingly turns out that the tensile strength of an inventive wire may be adjusted to values even in the range of conventional AlSi1-alloy-wires.

Concerning more preferred detail embodiments of the method for manufacturing the wire, in particular with respect to optimized annealing parameters, reference is made to the above description of an inventive wire.

The invention is further exemplified by an example. This example serves for exemplary elucidation of the invention and is not intended to limit the scope of the invention or the claims in any way.

Example

An alloy is prepared by melting a predetermined amount of pure aluminum (purity >99.99%) and adding a predetermined amount of pure scandium in order to obtain a well-mixed composition as follows (in weight-%):

| Aluminum | Scandium | Balance/unavoidable Contaminants |
|---|---|---|
| 99.8% | 0.18% | <0.02% |

The molten mixture is cast into an ingot and cooled. The ingot is extruded into a cylindrical shape. An optional drawing step may be performed on the extruded cylinder. A wire core precursor of about 1 mm diameter is obtained.

The 1 mm diameter wire core precursor is then homogenized in a homogenization step. In this step, the core precursor is inserted into an annealing oven preheated to a temperature of 640° C. The core precursor remains in the oven at a constant temperature of 640° C. for an exposure time of several hours. After this period, the entire amount of the scandium is dissolved in the aluminum lattice.

After the exposure time, the hot core precursor is immediately quenched by dipping into cold water. A cooling rate of more than 100 K per second is achieved by the quenching. This rapid cooling prohibits the formation of larger grains of scandium-containing phases.

After homogenization, the precursor is drawn or otherwise formed into a thick wire, typically between 80 µm and 600 µm. Performing the homogenization before drawing of the wire reduces the wear of the drawing tools and improves their lifetime.

If the final wire is formed as a thick wire, the process may be terminated or may be followed by a final annealing step for adjusting the mechanical properties.

If the final wire is to be a thin wire, controlled precipitation hardening is now performed on the thick wire, in which the diameter after the first series of drawing and/or forming steps is considered to be an intermediate diameter. The precipitation hardening is performed by exposing the wire to a temperature typically in the range of 250° C. to 400° C., preferably about 300° C., for several hours. Such a temperature is typically lower than the temperature used for homogenization.

During the precipitation hardening, a finely dispersed intermetallic phase $Al_3Sc$ builds up. Such precipitation of the previously dissolved scandium provides for enhancement of the electrical conductivity of the wire. Furthermore, hardness and tensile strength of the wire are improved.

Good results are obtained if more than 30%, even better more than 70%, of the scandium precipitates in the $Al_3Sc$ intermetallic phase. Most preferably, this phase is predominantly present in the form of very fine grains, in which at least two out of three of the grains have an average diameter of preferably less than 500 nm, more preferably less than 300 nm, even more preferably less than 150 nm and most preferably less than 25 nm, with a particularly preferred range between 20-200 nm. The diameter of a grain is presently defined in the ordinary way as the maximum diameter distance which can be laid through the grain.

FIG. 1 is a graph of tensile strength and elongation as a function of annealing time at a temperature of 300° C. The tensile strength is given as breakload "BL" in units of cN (centinewton). As the wire has a diameter of 100 μm, a breakload of 150 cN is equal to 191 MPa. It can be seen from the diagram that such a value is easily reached.

This tensile strength allows for further drawing of the wire down to thin wire diameters. A typical thin wire diameter which is easily reached is less than 50 μm.

Figure 2:
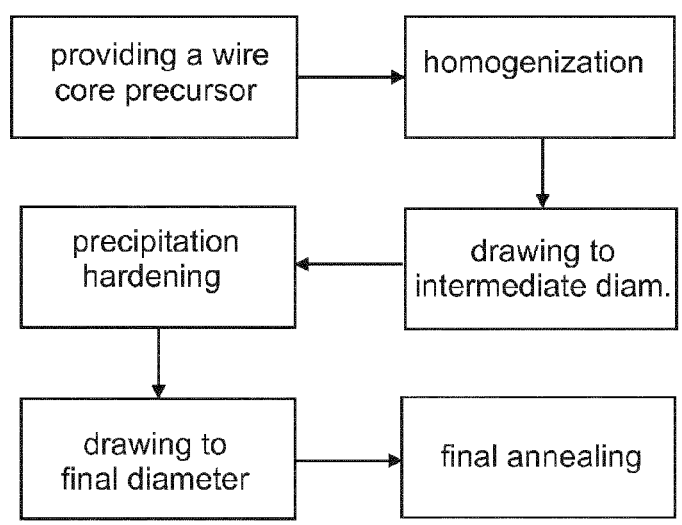
FIG. 2 is a flowchart of a method of manufacturing an inventive wire according to an embodiment of the invention.

After drawing to the final wire diameter, the wire is exposed to a further, final annealing step, as shown in the flow chart in FIG. 2. Such a step may be identical or similar to the precipitation heating. Alternatively, it may involve exposure to rather moderate annealing temperatures below 250° C. Such final annealing is performed in order to reduce stress and lattice defects which have been introduced by the deformation of the material.

Table 1 below shows measured conductivities of two thick wires with a diameter of 300 μm and different scandium contents. The measurements were performed on a 1.0 m length of wire with an applied current of 10 mA in a four-point-setup.

TABLE 1

| Scandium content | Homogenization 48 h at 640° C. | Precipitation Annealing 7 h at 300° C. | Stress annealing 7 h at 300° C. | Conductivity [m/(Ohm*mm$^2$)] |
| --- | --- | --- | --- | --- |
| 0.18% | yes | no | no | 33.15 |
| 0.18% | yes | yes | yes | 35.42 |
| 0.25% | no | no | yes | 35.62 |

For the 0.25% scandium sample, homogenization was not performed, but the ingot as delivered is considered to be quite homogenized.

Generally, the data prove that conductivity is enhanced by precipitation of scandium-containing phase because less disturbance is caused in the aluminum lattice by dissolved scandium. Further, it is shown that conductivity values of more than $33.0*10^6$ Ohm$^{-1}$*m$^{-1}$ are easily reached.

Concerning the fineness of the precipitated $Al_3Sc$ phase, measurements using a FIB system (FIB=Focused Ion Beam) were made. The spatial resolution of the FIB system was about 20 nm. Several FIB-cuts of at least 100 μm$^2$ were made on wire sample and evaluated for grains. Due to the purity of the used materials, it is assumed that all grains belong to the $Al_3Sc$ phase.

Measurement with the FIB system and evaluation turned out the following results:

For the material as delivered, grains at an average diameter of 25 nm with a standard deviation of 7 nm were observed.

No visible grains were present after homogenization over 48 hours at 640° C.

After precipitation annealing at 300° C. for 7 hours, still no grains were observed. Considering the resolution of the FIB system and the change of electrical and mechanical properties, the precipitation of a fine $Al_3Sc$ phase with grain sizes not bigger than 20 nm can be derived.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A bonding wire comprising a core having a surface, wherein the core comprises aluminum as a main component and the core contains scandium in an amount between 0.05% and 1.0%, wherein at least 30% of the scandium in the core is present in a phase separate from the aluminum main component, wherein the phase is an intermetallic phase comprising mainly $Al_3Sc$, and wherein at least two thirds of a total number of crystallites of the intermetallic phase have a diameter of less than 25 nm.

2. The wire according to claim 1, wherein the core comprises between 0% and 0.5% silicon.

3. The wire according to claim 1, wherein a total of components of the core other than aluminum and scandium is between 0% and 1.0%.

4. The wire according to claim 1, wherein the core contains at least one element selected from the group consisting of copper and nickel in an amount between 10 ppm and 100 ppm.

5. The wire according to claim 1, wherein the wire has a conductivity of at least $32.0*10^6$ Ohm$^{-1}$*m$^{-1}$.

6. The wire according to claim 1, wherein the wire has a diameter in a range of 80 μm to 600 μm.

7. The wire according to claim 1, wherein the wire has a diameter in a range of 8 μm to 80 μm.

8. A system for bonding an electronic device, comprising a first bonding pad, a second bonding pad and a wire according to claim 1, wherein the wire is connected to at least one of the first and second bonding pads by wedge-bonding.

9. The system according to claim 8, further comprising a structure underlying the first and second bonding pads comprising at least one layer of porous silicon dioxide.

10. A method for manufacturing a bonding wire according to claim 1, comprising the steps of:
    a. providing an aluminum core precursor with a desired content of scandium; and
    b. drawing and/or rolling the precursor to reach a final diameter of the wire core.

11. The method according to claim 10, further comprising a step of homogenizing the core precursor or the final wire.

12. The method according to claim 11, wherein the step of homogenizing is performed prior to a final drawing step.

13. The method according to claim 11, wherein the step of homogenizing comprises heating the core precursor or the final wire to a homogenization temperature of at least 450° C. for a defined time.

14. The method according to claim 13, wherein the heating is followed by a rapid cooling at a rate of at least 10 K per second.

15. The method according to claim 10, further comprising a step of precipitation hardening of the wire.

\* \* \* \* \*